United States Patent
Jin et al.

(10) Patent No.: US 10,431,637 B2
(45) Date of Patent: Oct. 1, 2019

(54) TOUCH DISPLAY PANEL AND DISPLAY APPARATUS

(71) Applicant: SHANGHAI TIANMA AM-OLED CO., LTD., Shanghai (CN)

(72) Inventors: Jian Jin, Shanghai (CN); Congyi Su, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 42 days.

(21) Appl. No.: 15/786,235

(22) Filed: Oct. 17, 2017

(65) Prior Publication Data

US 2018/0053810 A1    Feb. 22, 2018

(30) Foreign Application Priority Data

May 18, 2017 (CN) .......................... 2017 1 0354797

(51) Int. Cl.
| | |
|---|---|
| *G06F 3/041* | (2006.01) |
| *H01L 27/32* | (2006.01) |
| *H01L 51/52* | (2006.01) |
| *G06F 3/044* | (2006.01) |

(52) U.S. Cl.
CPC ............ *H01L 27/323* (2013.01); *G06F 3/044* (2013.01); *G06F 3/0412* (2013.01); *G06F 3/0416* (2013.01); *H01L 51/525* (2013.01); *H01L 51/5253* (2013.01)

(58) Field of Classification Search
CPC . H01L 27/323; H01L 51/5253; H01L 51/525; G06F 3/0416; G06F 3/044; G06F 3/0412
See application file for complete search history.

(56) References Cited

U.S. PATENT DOCUMENTS

| | | | |
|---|---|---|---|
| 2015/0014652 A1* | 1/2015 | Choi | C23C 14/06 257/40 |
| 2016/0062520 A1* | 3/2016 | Choi | H01L 27/3248 345/174 |
| 2018/0061728 A1* | 3/2018 | Chen | H01L 51/5246 |
| 2018/0088726 A1* | 3/2018 | Gwon | G06F 3/0412 |
| 2018/0095567 A1* | 4/2018 | Lee | H01L 51/5284 |
| 2018/0097198 A1* | 4/2018 | Chou | H01L 51/5253 |

FOREIGN PATENT DOCUMENTS

CN        103247234 A    8/2013

* cited by examiner

*Primary Examiner* — Amit Chatly
(74) *Attorney, Agent, or Firm* — Alston & Bird LLP

(57) ABSTRACT

The application discloses a touch display panel which has a display region and a non-display region; a first retaining wall is located in the non-display region surrounding the display region. A thin film encapsulation layer disposed on the organic light-emitting structure and the first retaining wall. The thin film encapsulation layer in the first opening extends to the non-display region in a slope, the slope reduces a thickness of the thin film encapsulation layer gradually. A plurality of touch electrodes disposed on the thin film encapsulation layer in the display region and a plurality of pad disposed in the non-display region are connected by the touch lines. The touch lines are located on the slope of thin film encapsulation layer.

20 Claims, 11 Drawing Sheets

TOUCH DISPLAY PANEL AND DISPLAY APPARATUS

CROSS-REFERENCES TO RELATED APPLICATIONS

This application claims priority to Chinese patent application No. CN201710354797.9, filed on May 18, 2017, the disclosure of which is incorporated herein by reference in its entirety.

TECHNICAL FIELD

The present disclosure relates to the field of display, in particular to a touch display panel and a display apparatus.

BACKGROUND

Organic Light Emitting Diode (OLED) display is a self-luminous display device. Compared with a Liquid Crystal Display (LCD), an OLED display does not need a backlight, so an OLED display can be made thinner and lighter. In addition, an OLED display also has advantages such as high brightness, low power consumption, wide viewing angle, high response speed, wide temperature range, and is used more in a variety of high-performance display applications.

In related arts, thin film organic encapsulation is often employed to ensure that organic luminescent materials and electrodes are not eroded by water vapor and oxygen in the external environment. Meanwhile, in order to avoid an increase of unavailable areas at the periphery of the device caused by an extension of the thin film encapsulation layer, a retaining wall is typically provided surrounding the organic light-emitting structure in the related arts. In order to cover foreign materials on the surface of the substrate and still keep the substrate flat, the organic layer of the thin film encapsulation generally has a very thick film structure. The thin film encapsulation layer forms a step and a slope at the edge of the retaining wall. The metal wires tend to drop over the retaining walls. As a result, wires can fracture and signal transmission can be affected.

SUMMARY

The present disclosure provides a touch display panel and a display apparatus, which can avoid fractures of metal wires across the retaining walls at the periphery of an OLED device and improve the reliability of signal transmission.

According to a first aspect, an embodiment of the present disclosure provides a touch display panel. The touch display panel includes:

a display region and a non-display region;

a substrate;

an organic light-emitting structure, located in the display region;

a first retaining wall, located in the non-display region and surrounding the display region;

a thin film encapsulation layer, covering the organic light-emitting structure and the first retaining wall; and a touch electrode and a touch line, both located on the thin film encapsulation layer and located at a side of the thin film encapsulation layer facing away from the substrate;

where the first retaining wall is provided with at least one first opening, the thin film encapsulation layer extends from the display region to the non-display region through the first opening, a thickness of the thin film encapsulation layer is gradually reduced in a direction perpendicular to the substrate so as to form a thinned region, the touch line is connected with the touch electrode and a pad which is in the non-display region via the thinned region.

According to a second aspect, an embodiment of the present disclosure provides a display apparatus including the touch display panel of any embodiment of the disclosure.

According to the present disclosure, the first retaining wall is provided with the first opening, so the thickness of the thin film encapsulation layer gradually decreases after passing through the first opening to form a thinned region. Since the thickness of the thinned region gradually decreases, a surface of the thin film encapsulation layer in the thinned region facing away from the substrate is a relatively smooth slope, the touch line does not need to go across a very high step or a very great slope when the touch line is connected with the touch electrode and the pad via the thinned region, thereby avoiding the fracture of the touch line and improving the reliability of signal transmission.

DETAILED DESCRIPTION

The disclosure will now be described in further detail with reference to the accompanying drawings and embodiments. It is to be understood that the specific embodiments described herein are for the purpose of explaining the disclosure and are not intended to limit the disclosure. It is further to be noted that, for the convenience of description, only parts related to the disclosure, rather the entire structure, are shown in the accompanying drawings.

Figure 1:
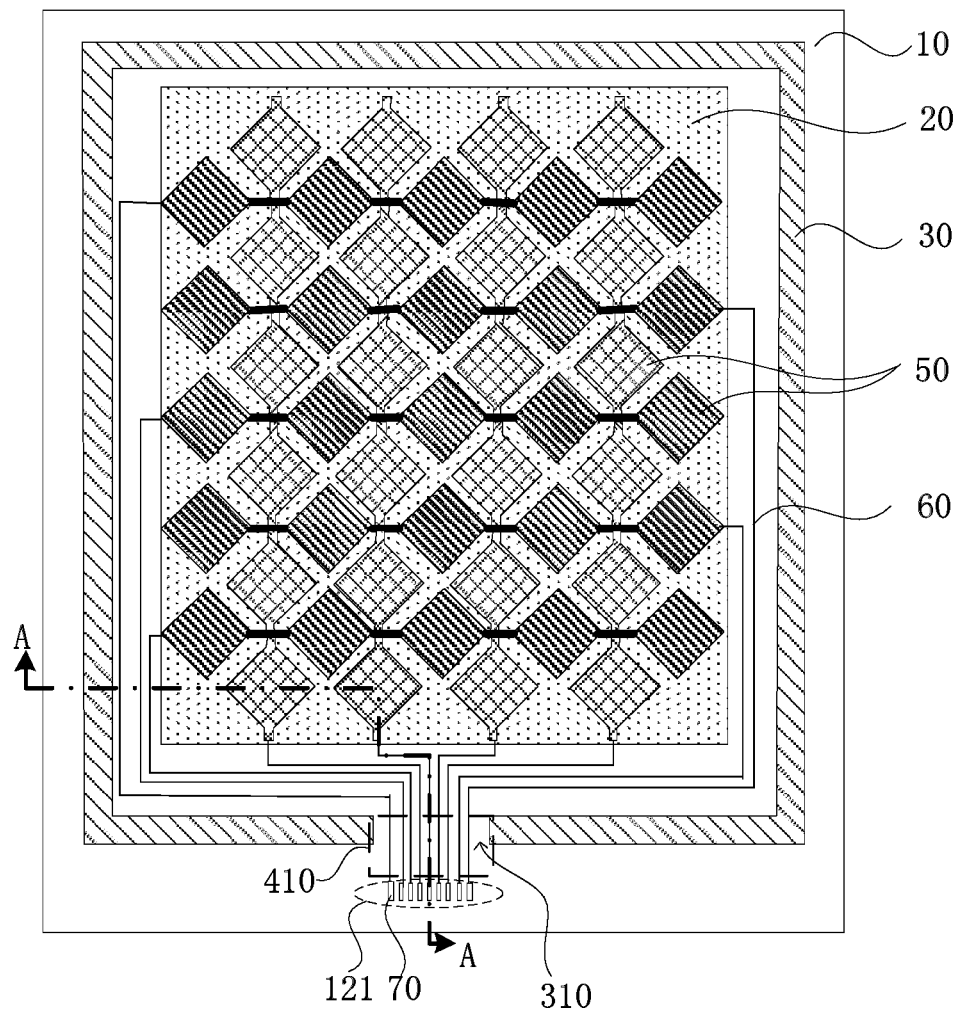
FIG. 1 is a schematic top view of a touch display panel according to an embodiment of the present disclosure.
Figure 2:
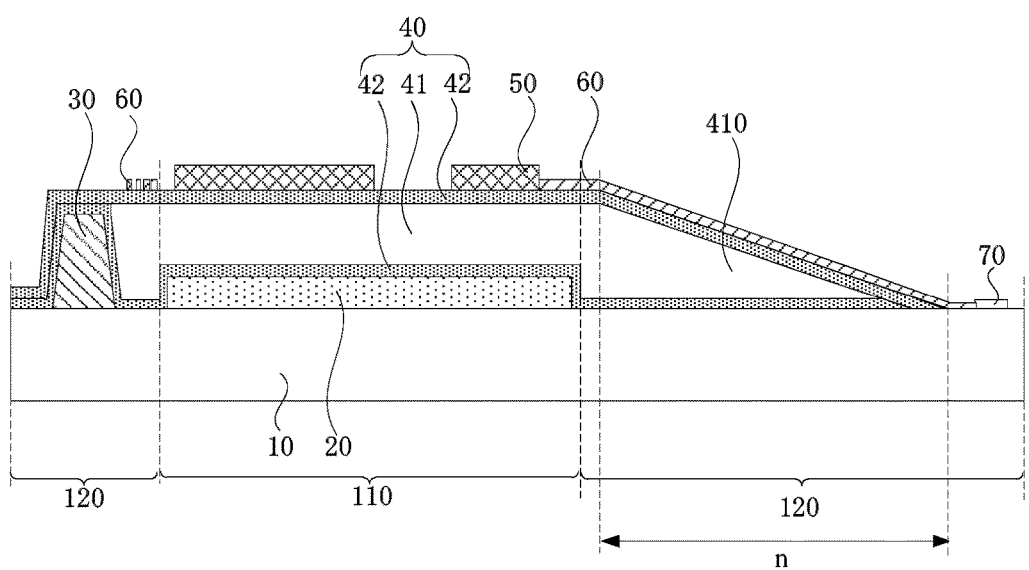
FIG. 2 is a cross sectional view of the touch display panel in FIG. 1 taken along a section line A-A.

FIG. 1 is a schematic top view of a touch display panel according to an embodiment of the present disclosure, and FIG. 2 is a cross sectional view of the touch display panel in FIG. 1 taken along a section line A-A. With reference to FIG. 1 and FIG. 2, the touch display panel includes:

a display region 110 and a non-display region 120;

a substrate 10;

an organic light-emitting structure 20, which is located in the display region 110;

a first retaining wall 30, which is located in the non-display region 120 and surrounds the display region 110;

a thin film encapsulation layer 40 (not shown in FIG. 1) overlays the organic light-emitting structure 20 and the first retaining wall 30; and a touch electrode 50 and a touch line 60 are located over the thin film encapsulation layer 40 including its slope.

The first retaining wall 30 is provided with at least one first opening 310. At the first opening 310, the thin film encapsulation layer 40 extends from the display region 110 to the non-display region 120 through the first opening 310. A thickness of the thin film encapsulation layer 40 in a direction perpendicular to the substrate 10 is gradually reduced so as to form a thinner region 410. The touch line 60 is connected with the touch electrode 50 and a pad 70 in the non-display region 120 via the thinned region 410. In the present embodiment, the substrate 10 is an array substrate that drives the organic light-emitting structure 20 to emit light. The substrate 10 includes the display region 110 and the non-display region 120. The display region 110 is correspondingly provided with the organic light-emitting structure 20 to implement image displaying. A region corresponding to the non-display region 120 does not present the image. The array substrate includes a substrate, which may be flexible and may be made of any suitable insulating material. For example, the flexible substrate may be made of polymer materials such as Polyimide (PI), Polycarbonate (PC), Polyethersulfone (PES), Polyethylene terephthalate (PET), Polyethylene naphthalate (PEN), Polyarylate (PAR) or Glass fiber reinforced Plastic (FRP) and the like. The substrate 10 may be transparent, semitransparent, or opaque.

A buffer layer is provided on the flexible substrate and covers the entire upper surface of the flexible substrate. In one embodiment, the buffer layer includes an inorganic layer or an organic layer. For example, the buffer layer may be made of inorganic materials selected from silicon oxide (SiOx), silicon nitride (SiNx), Silicon Oxynitride (SiOxNy), Aluminum oxide (AlOx), or Aluminum nitride (AlNx) and the like; or be made of materials selected from organic materials such as Acryl, Polyimide (PI) or polyester and the like. The buffer layer may include a single layer or multiple layers. The buffer layer blocks oxygen and moisture, prevents moisture or impurities from diffusing via the substrate, and provides a flat surface on the upper surface of the flexible substrate.

The substrate 10 further includes a thin film transistor (TFT), which is located on the buffer layer. Taking a top gate type TFT as an example, the TFT includes a semiconductor active layer on the buffer layer. The semiconductor active layer includes a source region and a drain region which are doped with N type impurity ions or P type impurity ions. A region between the source region and the drain region is a channel region which is not doped with impurity.

The semiconductor active layer may be formed by changing the amorphous silicon to polysilicon by crystallization of the amorphous silicon.

In order to crystallize amorphous silicon, various methods such as Rapid Thermal Annealing (RTA), Solid Phase Crystallization (SPC), Excimer Laser Annealing (ELA), Metal Induced Crystallization (MIC), Metal Induced Lateral Crystallization (MILC) or Sequential Lateral Solidification (SLS) and the like may be employed.

A gate insulation layer includes an inorganic layer such as silicon oxide, silicon nitride or metal oxide, and may include a single layer or multiple layers.

A gate electrode is provided in a specific region on the gate insulation layer. The gate electrode 118 may include a single layer or multiple layers of gold (Au), silver (Ag), copper (Cu), nickel (Ni), platinum (Pt), palladium (Pd), aluminum (Al), molybdenum (Mo) or Chromium (Cr); or alloys such as aluminum (Al)-neodymium (Nd) alloy, molybdenum (Mo)-tungsten (W) alloy.

An interlayer insulation layer is disposed on the gate electrode. The interlayer insulation layer may be formed by an inorganic insulation layer such as silicon oxide or silicon nitride. Optionally, the interlayer insulation layer may be formed by an organic insulation layer.

A source electrode and a drain electrode are disposed on the interlayer insulation layer. The source electrode and the drain electrode are electrically connected (or bonded) with the source region and the drain region via contact holes, respectively. The contact holes are formed by selectively removing the gate insulation layer and the interlayer insulation layer.

A passivation layer is disposed on the source electrode and the drain electrode. The passivation layer may be formed by an organic layer or an inorganic layer such as silicon oxide or silicon nitride.

A planarization layer is disposed on the passivation layer. The planarization layer includes an organic layer of Acrylic, Polyimide (PI) or Benzocyclobutene (BCB) and the like.

The organic light-emitting structure 20 is formed on the TFT, and is located in the display region 110. The organic light-emitting structure 20 generally includes a first electrode, a light-emitting layer and a second electrode.

In order to form the organic light-emitting structure 20, the first electrode (anode) is electrically connected (or bonded) with the source electrode or the drain electrode via a contact hole. The first electrode serves as the anode and may be formed by various conductive materials. For example, the first electrode may be formed as a transparent electrode or a reflective electrode according to its application. When the first electrode is formed as the transparent electrode, the first electrode may include indium tin oxide (ITO), indium zinc oxide (IZO), zinc oxide (ZnO) or indium oxide (In2O3), etc. When the first electrode is formed as the reflective electrode, the reflective layer may be formed of Ag, magnesium (Mg), Al, Pt, Pd, Au, Ni, Nd, iridium (Ir), Cr, or a mixture thereof, and ITO, IZO, ZnO or In2O3 may be formed on the reflective layer.

A pixel define layer (PDL) is disposed on the planarization layer to cover edges of the first electrode. In an embodiment, the pixel define layer surrounding edges of the first electrode defines an emitting region of each sub pixel. The pixel define layer may be formed of an organic material such as polyimide (PI), polyamide, Benzocyclobutene (BCB), acrylic resin or phenolic resin.

The light-emitting layer is disposed on the first electrode. The portion of the first electrode on which the light-emitting layer is disposed is not covered by the pixel define layer and is exposed. The light-emitting layer may be formed by a vapor deposition process. The light-emitting layer is patterned to correspond every sub pixel, that is, to correspond the patterned first electrode.

The light-emitting layer may be formed of an organic material with a low molecular weight or an organic material with a high molecular weight. The light-emitting layer includes an organic emitting layer and may further include at least one of a hole injection layer (HIL), a hole transport layer (HTL), an electron transport layer (ETL) and an electron injection layer (EIL). However, in addition to the organic emitting layer, the light-emitting layer may include various other function layers.

The second electrode (serving as a cathode of an organic light-emitting device (OLED)) is disposed on the light-emitting layer. Similar to the first electrode, the second electrode may be formed as a transparent electrode or a reflective electrode.

The first electrode and the second electrode are insulated from each other by the light-emitting layer. If a voltage is applied between the first electrode and the second electrode, the light-emitting layer emits visible lights, thereby achieving an image that can be identified by a user.

When the second electrode is formed as the transparent electrode, a compound having a small work function and including lithium (Li), calcium (Ca), lithium fluoride/calcium (LiF/Ca), lithium fluoride/aluminum (LiF/Al), aluminum (Al), magnesium (Mg) or combinations thereof may be initially deposited on the light-emitting layer by an evaporation, and the forming material of the transparent electrode such as ITO, IZO, ZnO or In2O3 may be deposited on the compound. When the second electrode is formed as the reflective electrode, the second electrode may be formed by evaporating Li, Ca, LiF/Ca, LiF/Al, Al, Mg or a mixture thereof on the entire surface of the substrate.

The thin film encapsulation layer 40 is disposed on the organic light-emitting structure 20. In one embodiment, the thin film encapsulation layer 40 protects the light-emitting layer and other thin layers from external moisture and oxygen. The thin film encapsulation layer 40 may include inorganic layers and organic layers. The inorganic layers and the organic layers are alternately stacked. The first retaining wall 30 is arranged in the non-display region 120 of the substrate 10, and surrounds the display region 110. The first retaining wall 30 generally formed by stacking the pixel define layer, the planarization layer and the supporting spacers. The first retaining wall 30 may serve as a cut-off layer for the organic layers of the thin film encapsulation layer 40, and is covered by the inorganic layer of the thin film encapsulation layer 40. Meanwhile, the first retaining wall 30 may further enhance the effect of blocking the oxygen and water of the touch display panel, and prevent the transmission and expansion of the cracks of the inorganic layers.

In order to realize the touch function of the touch display panel, the touch electrode 50 and the touch line 60 are provided on one side of the thin film encapsulation layer 40 facing away from the substrate 10, and the touch line 60 is connected to the touch electrode 50 and the pad 70 which is in the non-display region 120. Since the non-display region 120 of the touch display panel is provided with the first retaining wall 30, the touch line 50 needs to cross the first retaining wall 30 and the thin film encapsulation layer 40 forms a very high step at the edge of the first retaining wall 30. Therefore, the height of the touch line 60 after crossing the first retaining wall 30 decreases abruptly, causing the touch line 60 to be prone to fracture, etc., and affecting signal transmission.

According to the present embodiment, the first retaining wall 30 is provided with the first opening 310, so that the thickness of the thin film encapsulation layer 40 gradually decreases after passing through the first opening 310 to form a thinner region 410. Since the thickness of the thinned region 410 gradually decreases, the side of the thin film encapsulation layer 40 of the thinner region 410 facing away from the substrate 10 is a relatively smooth slope, and the touch line 60 firstly wires in the region surrounded by the first retaining wall 30 after being connected with the touch electrode 50, and goes across the first retaining wall 30 only at the first opening 310, that is, the touch line 60 is connected with the touch electrode 50 and the pad 70 through the thinned region 410. Therefore, the touch line 60 does not need to go across a very high step or a very great slope, thereby avoiding the fracture of the touch line 60 and improving the reliability of signal transmission.

Optionally, with reference to FIG. 1 and FIG. 2, the touch electrode 50 and the touch line 60 are provided on the surface of the thin film encapsulation layer 40 away from the substrate 10. Such configuration can decrease the overall thickness of the display panel, and is in line with the development trend of light and thin of the display panel.

Optionally, with reference to FIG. 1 and FIG. 2, the non-display region 120 includes a bonding region 121 where a display panel and a driver integrated circuit (IC) are interconnected. The pad 70 is disposed in the bonding region 121. The first opening 310 is provided on a portion of the first retaining wall 30 close to the bonding region 121 of the display panel.

Specifically, not all sides of the retaining wall in the non-display frame has an opening because an opening will reduce the bezel area which is not preferred.

When the first opening 310 is provided preferably at the retaining wall 30 close to the bonding region 121 of the display panel, although the sizes of the non-display region 120 of the display panel at the side of the bonding region 121 is increased due to the existence of the thinner region 410, the panel at the side of bonding region 121 may be bent when the display panel is assembled, so that the sizes of the bezel of the display panel will not be increased after the assembling is completed.

Optionally, with reference to FIG. 1 and FIG. 2, the thin film encapsulation layer 40 includes inorganic layers 42 and an organic layer 41 sandwiched between inorganic layers 42. At the first retaining wall 30 where the first opening is not provided, the organic layer 41 is located in the region surrounded by the first retaining wall 30, and the inorganic layers 42 overlay the first retaining wall 30.

Specifically, the inorganic layers 42 are directly formed into a solid state by a chemical vapor deposition process, and the organic layer 41 is formed by an ink jet printing process and is gradually solidified from a liquid state to a solid state. The organic layer 41 has maintained certain fluidity during solidification. The first retaining wall 30 defines The organic layer 41 stays in the area outside the first retaining wall 30 to prevent the organic layer 41 from spreading into the display area by increasing the width of the non-display area 120. By arranging the inorganic layers 42 to block the first retaining wall 30 from outside, it is possible to prevent water vapor and oxygen from entering the display panel and to prevent the display panel from being corroded by water vapor or oxygen.

Optionally, the organic layers 41 and inorganic layers 42 go through the first opening 310 at the first opening 310, and extend from the display region 110 to the non-display region 120.

Specifically, the formation of the thinner region 410 is has low stress because the organic layer 41 of the thin film encapsulation layer 40 has enough thickness to protect and the organic layers 41 have certain fluidity.

Figure 3:
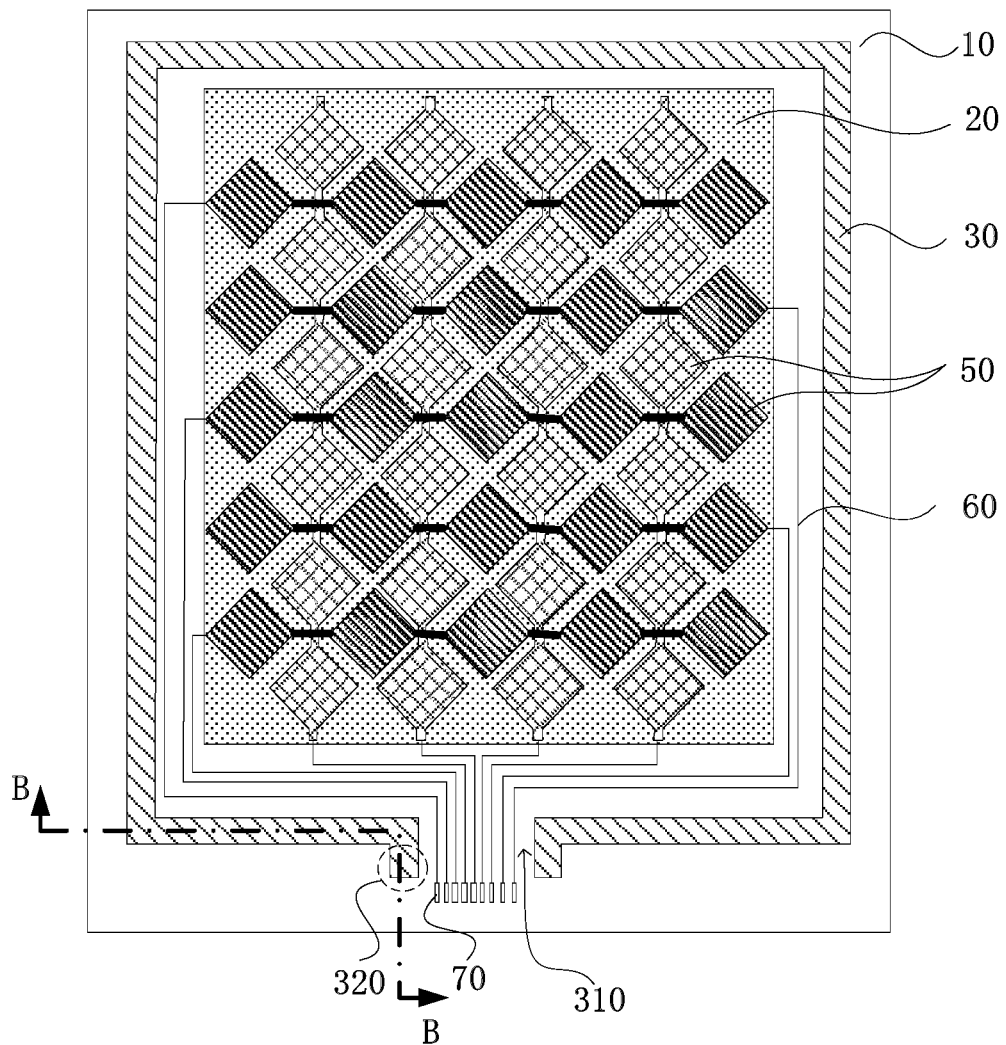
FIG. 3 is a schematic top view of another touch display panel according to an embodiment of the present disclosure.

FIG. 3 is a schematic top view of another touch display panel according to an embodiment of the present disclosure.

With reference to FIG. 3, two edges of the first opening 310 are provided with auxiliary retaining walls 320. The auxiliary retaining walls 320 extend from the first opening 310 to the non-display region 120.

Figure 4:
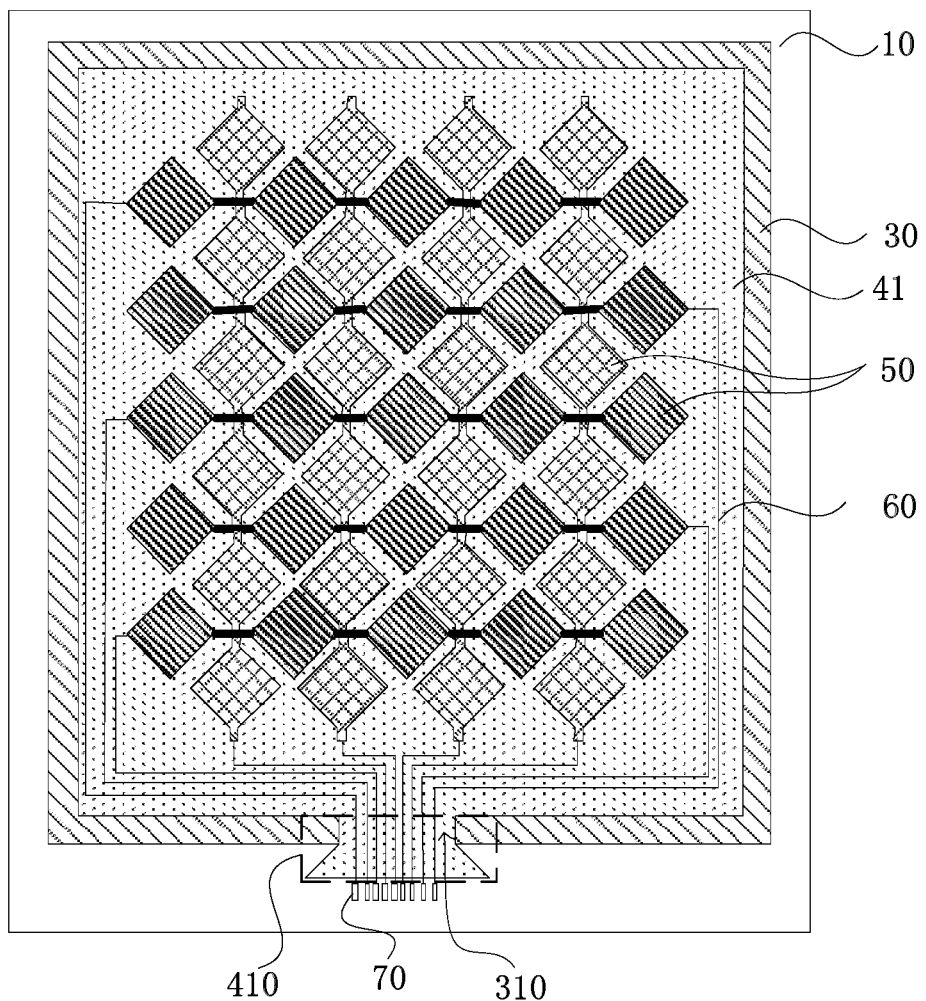
FIG. 4 is a schematic top view of another touch display panel according to an embodiment of the present disclosure.
Figure 5:
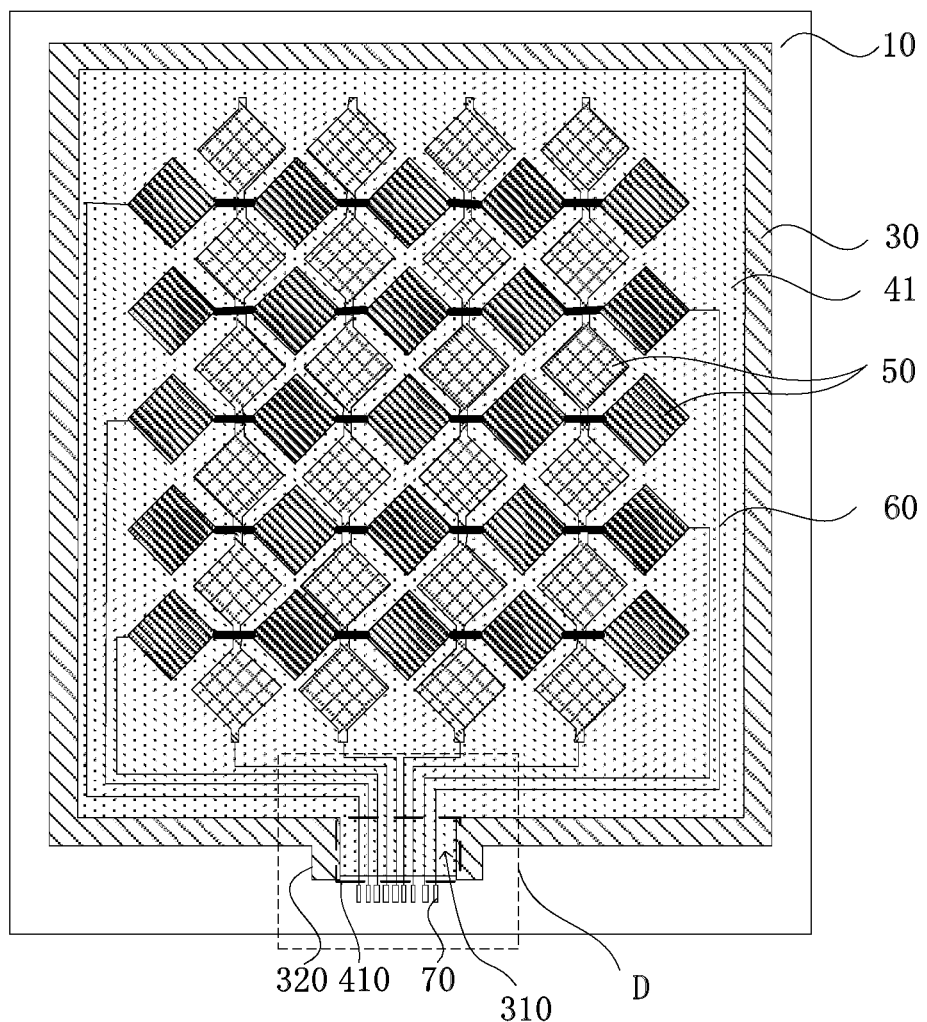
FIG. 5 is a schematic top view of another touch display panel according to an embodiment of the present disclosure.

FIG. 4 is a schematic top view of another touch display panel according to an embodiment of the present disclosure. FIG. 5 is a schematic top view of another touch display panel according to an embodiment of the present disclosure. The slope region 410 is formed largely due to the reduction of the thickness of the organic layer 41. In the thin film encapsulation layer shown in FIG. 4 and FIG. 5, only the organic layer 41 is depicted. Specifically, with reference to FIG. 4 and FIG. 5, if the auxiliary retaining walls 320 are not provided, the organic layer 41 in the thinned region 410, might spread into display area in the window of the opening 310. The total thickness of the sloped portion of the encapsulated layer may be reduced. This may make the difficulty of forming touch line 60 over it. By arranging the auxiliary retaining walls 320, the organic layer 41 in the thinned region 410 mainly spreads with better control into the first opening 310. Thus the slope is smoother and touch line 60 is better defined in forming.

It should also be noted that, with reference to FIG. 4, in the case where the auxiliary retaining walls 320 are not provided, when the touch line 60 is formed, the touch line 60 may be formed at the central region of the thinned region 410 as much as possible, that is, the touch line 60 is arranged to the vicinity of the symmetry axis of the two edges of the first opening 310 as much as possible.

Figure 6:
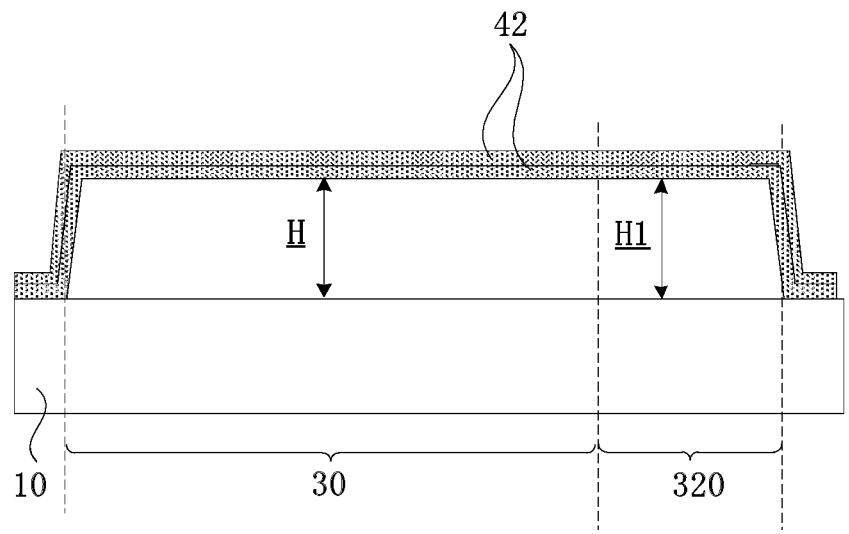
FIG. 6 is a cross sectional view of the touch display panel in FIG. 3 taken along a section line B-B.

FIG. 6 is a cross sectional view of the touch display panel in FIG. 3 taken along a cut line B-B. Optionally, with reference to FIG. 6, a height H1 of the auxiliary retaining wall 320 is equal to a height H of the first retaining wall 30 if the first opening is not provided. Such arrangement allows the auxiliary retaining wall 320 and the first retaining wall 30 formed in the same process, saving the thinning process steps and reducing process difficulty, and thus enabling the auxiliary retaining wall 320 to better block the organic layer 41 of the thin film encapsulation layer 40 from spreading to the outside of the auxiliary retaining wall 320.

Figure 7:
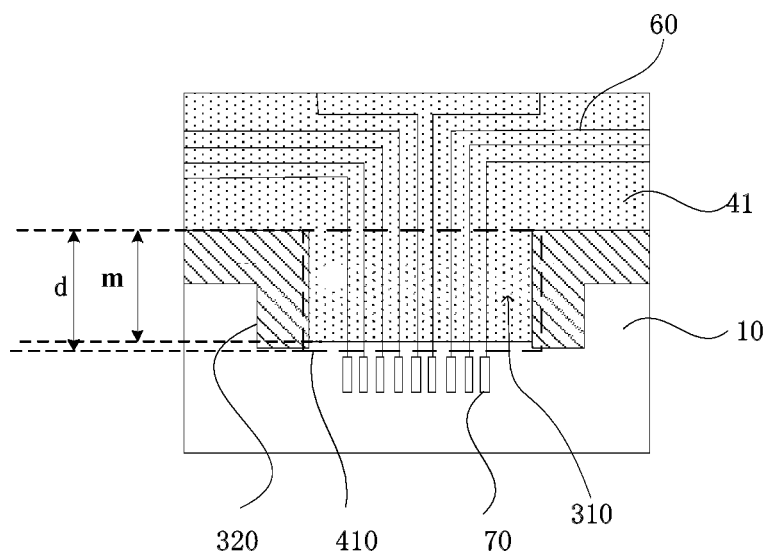
FIG. 7 is an enlarged top view of region D in FIG. 5.

FIG. 7 is an enlarged view of a region D in FIG. 5. Optionally, as shown in FIG. 7, a length d is the auxiliary retaining wall 320, the first opening 310's depth is deeper than or equal to a distance m between the first opening 310 and the boundary of organic layer 41 of the thin film encapsulation layer in the thinned region 410.

Such arrangement ensures that the auxiliary retaining wall 320 can better block the organic layer 41 of the thin film encapsulating layer 40. Since the length d of the auxiliary retaining wall 320 is greater than or equal to the depth m between the first opening 310 and the boundary of organic layer 41 of the thin film encapsulation layer in the thinned region 410, the organic layer 41 is completely confined between the auxiliary retaining walls 320, so that the thickness of the organic layer 41 is gradually reduced only in the direction perpendicular to the first retaining wall 30 where the first opening 310 is provided, the surface of the formed thinned region 410 away from the substrate 10 is a smooth slope, and the difficulty of the process of forming the touch line 60 is reduced.

Optionally, with reference to FIG. 1 to FIG. 5, the first opening 310 penetrates the first retaining wall 30 in the direction perpendicular to the substrate 10 at the first opening 310. That is, the first retaining wall 30 at the first opening 310 is completely removed, so that the organic layer 41 of the thin film encapsulation layer 40 can be rapidly thinned after passing through the first opening 310, and a size n of the thinned region 410 in the direction perpendicular to the first retaining wall 30 where the first opening 310 is provided is small, facilitating the realization of the narrow bezel of the display panel, reducing the length of the touch line 60, and avoiding the use of the long touch line 60 which affects the stability of the signal transmission.

Figure 8:
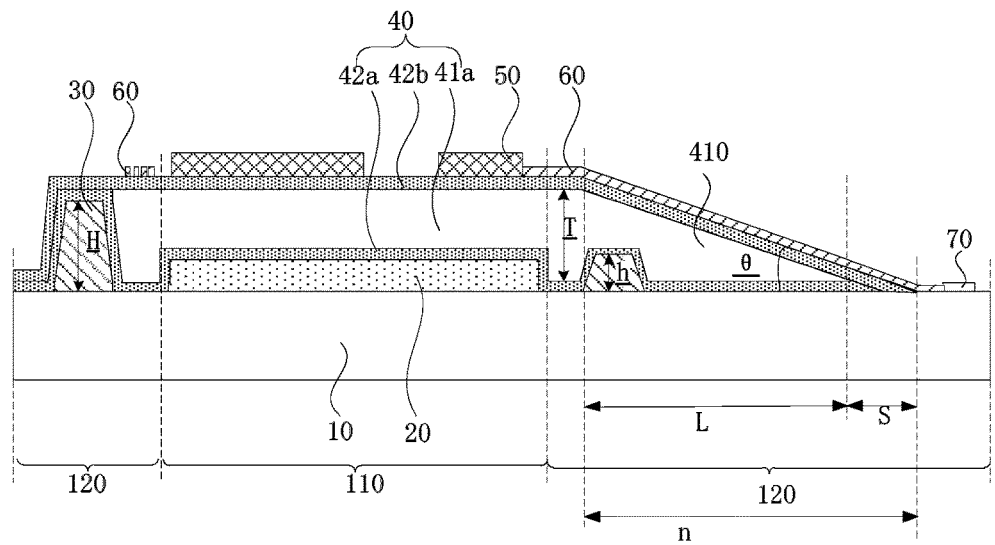
FIG. 8 is a schematic cross sectional view of another touch display panel according to an embodiment of the present disclosure.

FIG. 8 is a schematic cross sectional view of another touch display panel according to an embodiment of the present disclosure. Optionally, with reference to FIG. 8, the height H of the first retaining wall 30 where the first opening 410 is provided is greater than zero, and is less than the height H of the first retaining wall 30 where the first opening 410 is not provided.

Specifically, the thinning slope of the organic layer 41 in the thinned region 410 is configured by defining the height of the first retaining wall 30 where the first opening 410 is provided, so that a tilt angle of the surface of the thin film encapsulation layer 40 is fixed. That is, an angle θ between the substrate 10 and the surface of the thin film encapsulation layer 40 is managed to, ensure touch line 60 not abruptly change directions to fracture, thereby improving the reliability of signal transmission.

Optionally, with reference to FIG. 8, the thin film encapsulation layer 40 includes a first inorganic layer 42a, a first organic layer 41a and a second inorganic layer 42b. The organic layer 41a is sandwiched between the first inorganic layer 42a and second inorganic layer 42b on the substrate 10.

Specifically, the thin film encapsulation layer 40 therefore includes three layers of the first inorganic layer 42a, the first organic layer 41a, and the second inorganic layer 42b. The first inorganic layer 42a and the second inorganic layer 42b are mainly used for preventing water vapor and oxygen from entering the display panel and corroding the organic light-emitting structure 20. The first organic layer 41a mainly plays a buffering role, and reduces the stress between the first inorganic layer 42a and the second inorganic layer 42b. On one hand, it is ensured that water vapor and oxygen are prevented from entering the interior of the display panel, and on the other hand, the thin film encapsulation layer 40 has thickness agreeing to the development trend of light and thin of the display panel.

Optionally, with reference to FIG. 8, the height of the first retaining wall 30 where the first opening 310 is provided is h, the thickness of the first organic layer 41a in the region surrounded by the first retaining wall 30 is T, and 0<h<T. By setting h<T, the first organic layer 41a can cover the first retaining wall 30 at the first opening 310 to form the thinned region 410. By setting h>0, the thinning slope of the thickness of the first organic layer 41a is not steep, so that the tilt angle of the surface of the thin film encapsulation layer 40 in the thinned region 410 is small, that is, the angle θ is small, and the touch line 60 forms a smooth slope when connecting the touch electrode 50 and the pad 70 via the thinned region 410, thereby fractures of the touch line 60 is avoided, thereby reliability of signal transmission is improved.

Optionally, the thickness T of the first organic layer 41a in the region surrounded by the first retaining wall 30 is less than or equal to 20 μm. Specifically, by setting T≤20 μm, the buffering function of the first organic layer 41a is ensured, and it is also ensured that the thin film encapsulation layer 40 has a small layer thickness, which is in line with the development trend of the thinner and lighter display panel.

Optionally, in the thinned region 410, a distance between the first opening 310 and a boundary of first organic layer 41a in the direction perpendicular to the first retaining wall 30 where the first opening 310 is proved is L, where $$10 \le \frac{L}{T} \le 200.$$

Specifically, since the thinned region 410 is mainly formed by the first inorganic layer 41a, by setting 10≤L/T≤200, it is ensured that the slope degree of the surface of the thinned region 410 away from the substrate 10 is not too large, thereby ensuring that the touch line 60 does not need to go across a high step or a large slope, avoiding the fracture of the touch line 60 and improving the reliability of signal transmission. It is also ensured that the size n of the thinned region 410 in the direction perpendicular to the first retaining wall 30 where the first opening 310 is provided is not too large. It is not only benefit to achieve the narrow bezel of the display panel, but also can reduce length of the touch line 60, thereby avoiding the use of too long touch line 60 which affects the stability of signal transmission.

Optionally, with reference to FIG. 8, in the thinned region 410, in the direction perpendicular to the first retaining wall 30 where the first opening 310 is provided, a distance between the boundary of the first organic layer 41a and outermost boundaries of the first inorganic layer 42a and the second inorganic layer 42b is S, where 10 µm≤S≤500 µm.

Specifically, by setting 10 µm≤S≤500 µm, it does not only ensure that the first inorganic layer 42a and the second inorganic layer 42b can completely cover the edge of the first organic layer 41a, so that the water and oxygen seals can be well achieved at the edge of the thin film encapsulation layer 40, but also ensured that the size n of the thinned region 410 in the direction perpendicular to the first retaining wall 30 where the first opening 310 is provided is not too large. It is not only benefit to achieve the narrow bezel of the display panel, but also can reduce length of the touch line 60, thereby avoiding the use of too long touch line 60 which affects the stability of signal transmission.

Figure 9:
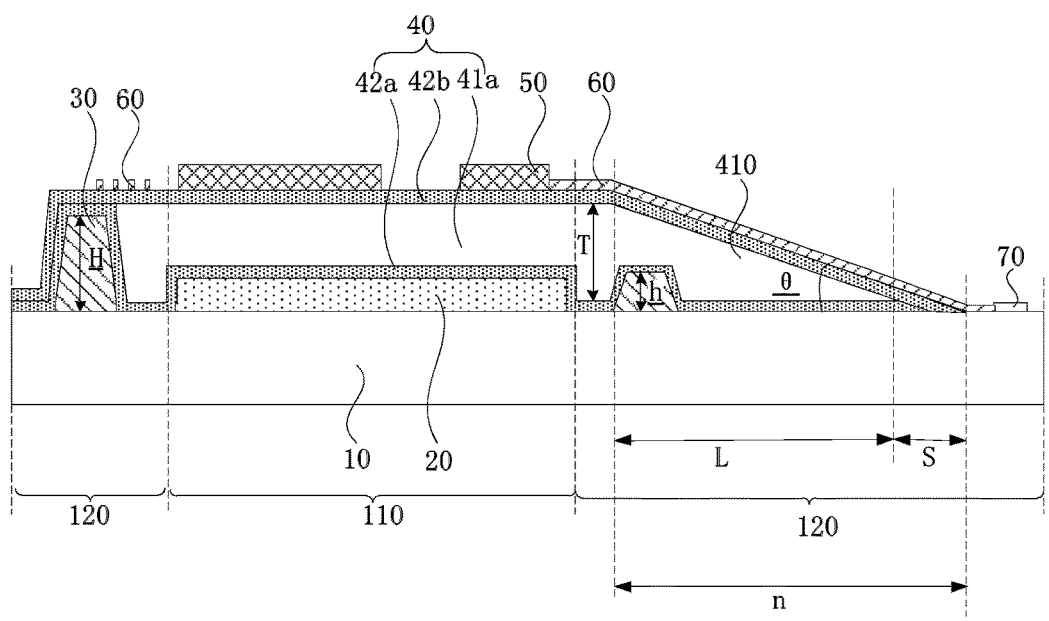
FIG. 9 is a schematic cross sectional view of another touch display panel according to an embodiment of the present disclosure.

Optionally, with reference to FIG. 8, the touch line 60 between the touch electrode 50 and the first opening 410 is arranged in a region between the first retaining wall 30 and the display region 110. FIG. 9 is a schematic view of another touch display panel according to an embodiment of the present disclosure. Optionally, with reference to FIG. 9, the touch line 60 between the touch electrode 50 and the first opening 410 may also be arranged in the region between the first retaining wall 30 and the display region 110 and in a region corresponding to a top portion of the first retaining wall 30.

Specifically, the top portion of the first retaining wall 30 is the surface of the first retaining wall 30 facing away from the substrate 10. The touch line 60 between the touch electrode 50 and the first opening 410 is arranged in the region between the first retaining wall 30 and display region 110 or in the region corresponding to a top portion of the first retaining wall 30. That is, the touch line 60 across the first retaining wall 30 only via the first opening 410. Since the thinned region 410 is existed at the first opening 410, it is ensured that the touch line 60 does not need to go across a very high step or a large slope, avoiding the fracture of the touch line 60. In addition, by arranging the touch line at the region corresponding to the top portion of the first retaining wall 30, a width of the region between the first retaining wall 30 and the display region 110 can be appropriately reduced, so that the size of the non-display region 120 of the display panel may be reduced, which is benefit to achieve the narrow bezel of the display panel. Specifically, a width of the top portion of the first retaining wall 30 may be 50 µm to 100 µm.

Figure 10:
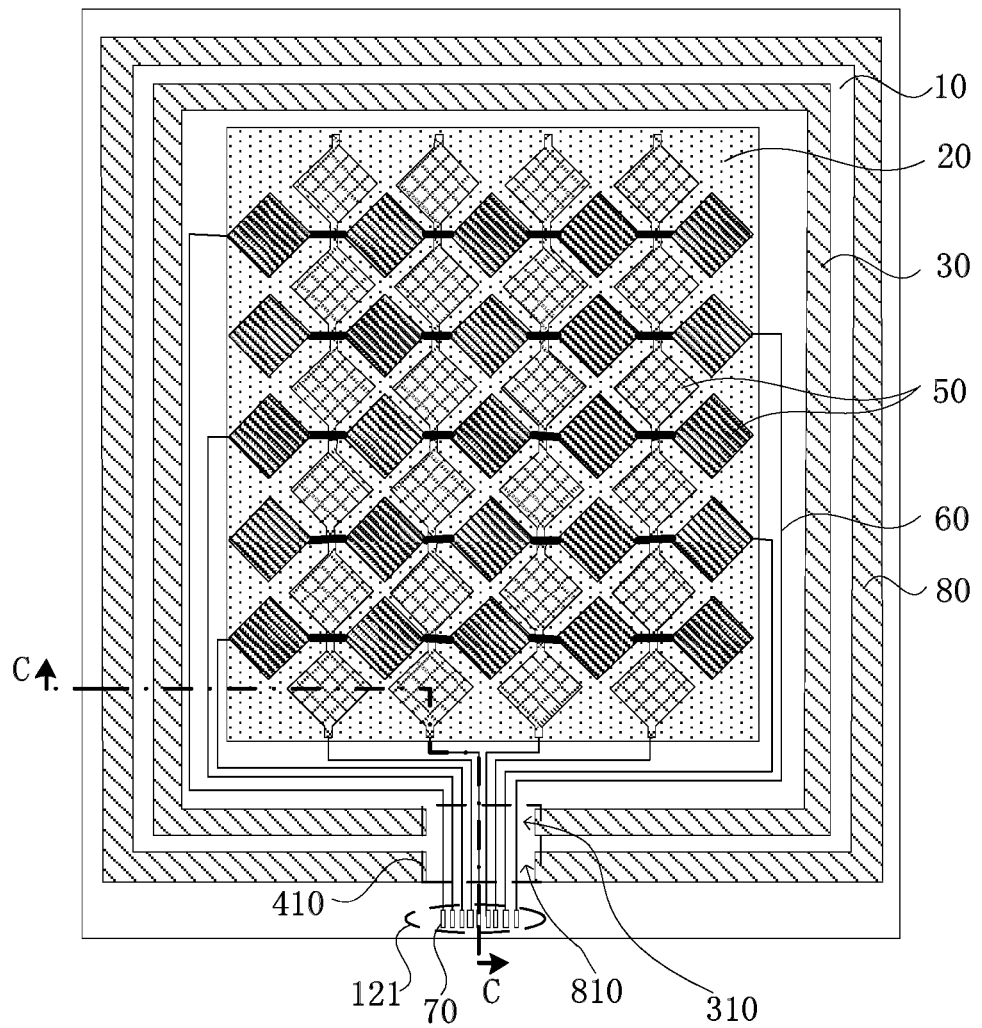
FIG. 10 is a schematic top view of another touch display panel according to an embodiment of the present disclosure.
Figure 11:
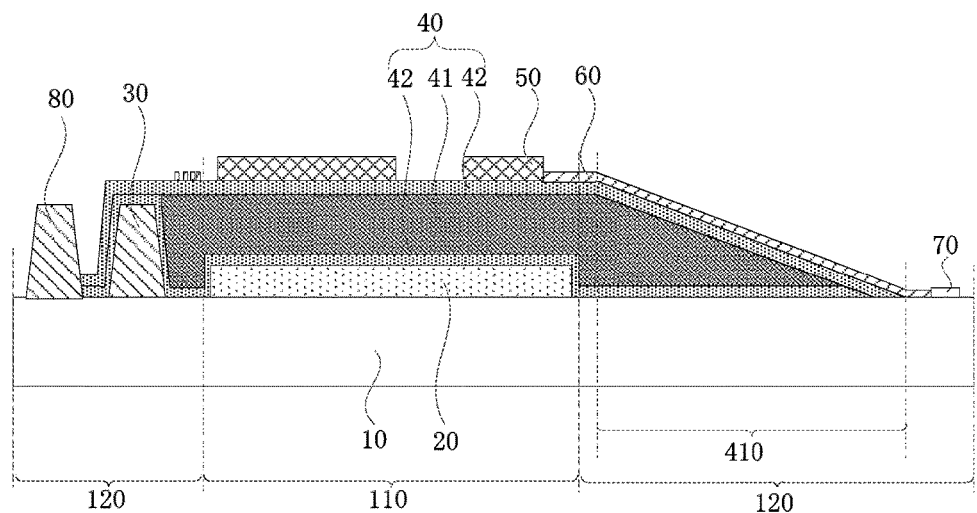
FIG. 11 is a cross sectional view of the touch display panel in FIG. 10 taken along a section line C-C.

FIG. 10 is a schematic view of another touch display panel according to an embodiment of the present disclosure. FIG. 11 is a sectional view of the touch display panel in FIG. 10 taken along a section line C-C. Optionally, with reference to FIG. 10 and FIG. 11, the display panel further includes a second retaining wall 80. The second retaining wall 80 is arranged at a side of the first retaining wall 30 away from the display region 110. The second retaining wall 80 surrounds the first retaining wall 30. The thin film encapsulation layer 40 is located in a region surrounded by the second retaining wall 80. A second opening 810 is provided on the second retaining wall 80 at a position corresponding to the first opening 310. The touch line 60 is connected with the touch electrode 50 and the pad 70 via the thinned region 410 and the second opening 810.

Specifically, the second retaining wall 80 is used for blocking the inorganic layer 42 of the thin film encapsulation layer 40 and to support a mask for fabricating the inorganic layer 42.

Figure 12:
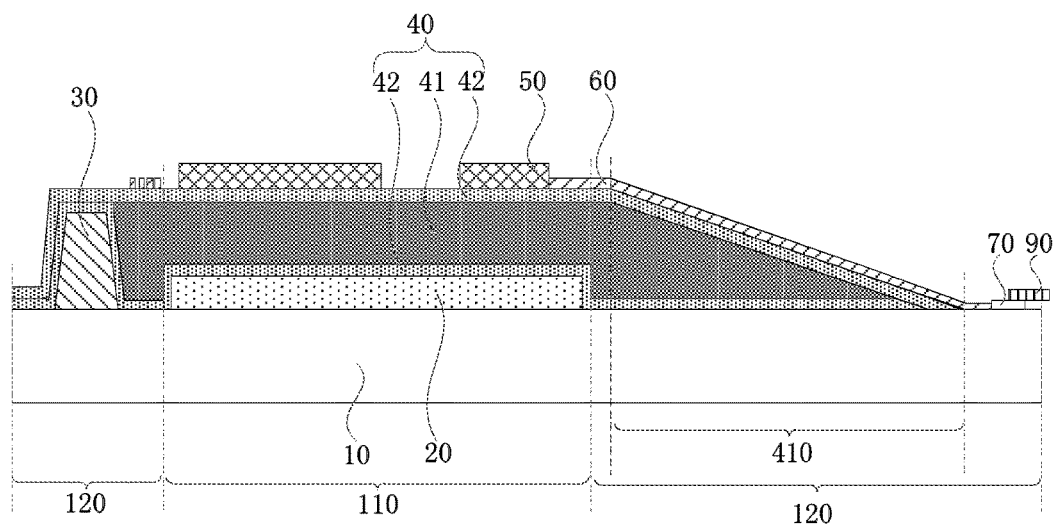
FIG. 12 is a schematic cross sectional view of another touch display panel according to an embodiment of the present disclosure.

FIG. 12 is a schematic view of another touch display panel according to an embodiment of the present disclosure. Optionally, as shown in FIG. 12, the display panel further includes a flexible circuit board 90. The flexible circuit board 90 is disposed in the non-display region 120. The flexible circuit board 90 is electrically connected with the pad 70. Optionally, the flexible circuit board 90 is configured to drive the display panel for display, and/or, the flexible circuit board 90 is configured to drive the touch electrode 50 for touch detection.

Specifically, the flexible circuit board 90 may be configured to simultaneously drive the display panel for display and drive the touch electrode 50 for touch detection without providing a separate driving circuit board for the touch electrode 50, thereby improving integration degree of the display panel and facilitating the reduction of the seizes of the display panel.

Figure 13:
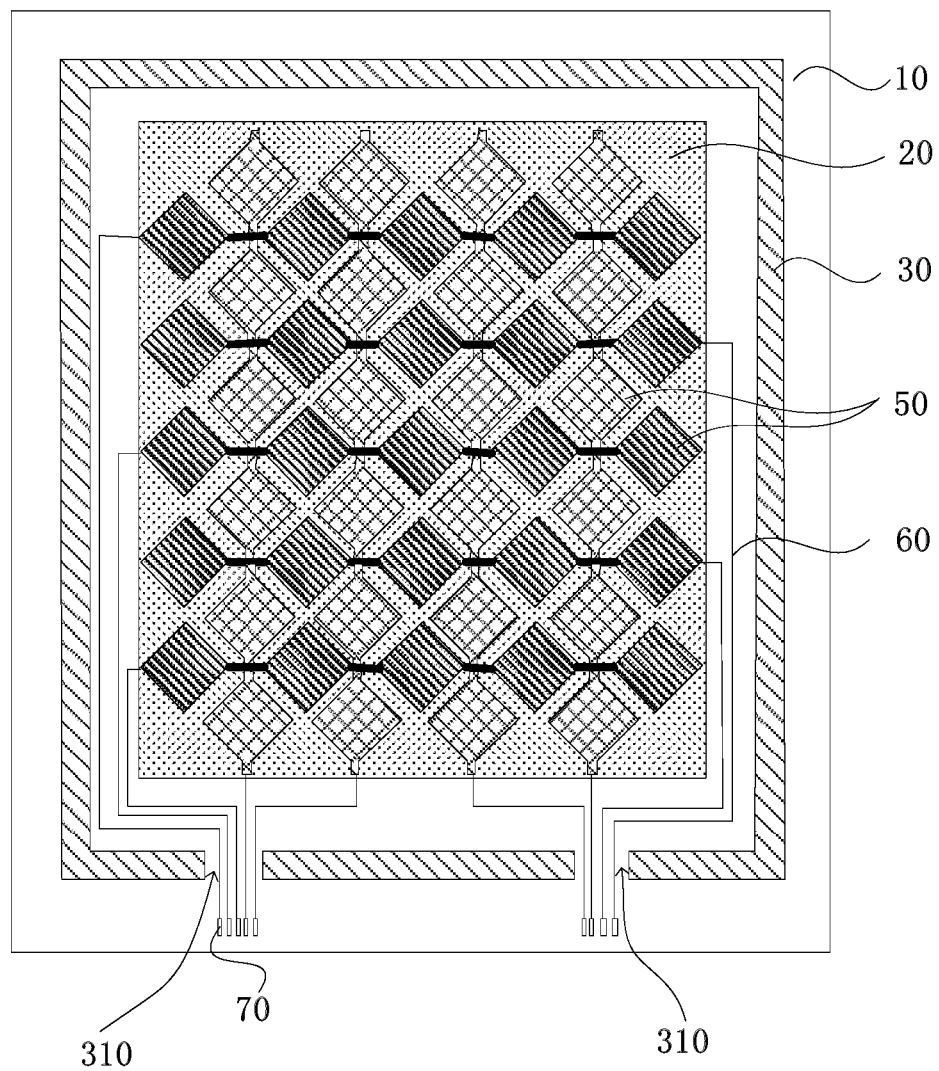
FIG. 13 is a schematic top view of another touch display panel according to an embodiment of the present disclosure.

It should be noted that FIG. 1 to FIG. 12 only show a configuration in which the first retaining wall 30 is provided with one first opening 310, and are not intended to limit the present disclosure. In other embodiments, the first retaining wall 30 may be provided with a plurality of first openings 310 according to the distribution of the touch lines 60. FIG. 13 is a schematic top view of another touch display panel according to an embodiment of the present disclosure. FIG. 13 illustrates a configuration in which the first retaining wall 30 is provided with two first openings 310. Accordingly, if the display panel is provided with the second retaining wall, the same number of second openings are provided at positions corresponding to the first openings 310 on the second retaining wall.

Figure 14:
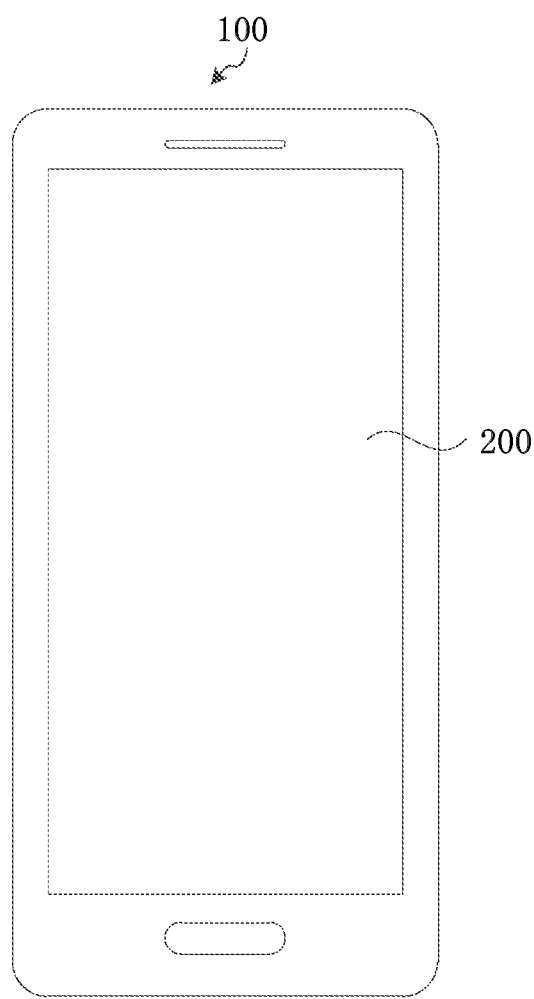
FIG. 14 is a schematic view of a display apparatus according to an embodiment of the present disclosure.

FIG. 14 is a schematic view of a display apparatus according to an embodiment of the present disclosure. With reference to FIG. 14, a display apparatus 100 includes the touch display panel 200 of any embodiment of the present disclosure. The display apparatus 100 may be electronic devices such as mobile phone, tablet computer and the like.

According to the display apparatus provided by the present embodiment, the first retaining wall of the display panel is provided with the first opening, so the thickness of the thin film encapsulation layer gradually decreases after passing through the first opening to form a thinned region. Since the thickness of the thinned region gradually decreases, a surface of the thin film encapsulation layer in the thinned region away from the substrate is a relatively smooth slope, the touch line does not need to go across a very high step or a very great slope when the touch line is connected with the touch electrode and the pad via the thinned region, thereby avoiding the fracture of the touch line and improving the reliability of signal transmission.

It is noted that the above is only preferred embodiments of the present disclosure and the technical principles employed. It will be understood by those skilled in the art that the present disclosure is not limited to the specific embodiments described herein and that various modifications, adaptations, combinations and substitutions can be made by those skilled in the art without departing from the scope of the present disclosure. Thus, while the present disclosure has been described in detail by way of the above embodiments, the present disclosure is not limited to the above embodiments, but may include more and more equivalent embodiments without departing from the inventive concept, and the scope of present disclosure is determined by the appended claims.

What is claimed is:

1. A touch display panel, comprising:
   a substrate;
   a first retaining wall, located on the substrate, wherein the substrate is divided into a first region and a second region by the first retaining wall, the first region is surrounded by the first retaining wall, the first region and the second region are communicated through a first opening or a first notch of the first retaining wall;
   an organic light emitting structure located in the first region;
   a thin film encapsulation layer disposed on the organic light-emitting structure and the first retaining wall, wherein the thin film encapsulation layer has a slope part extending from the first region into the second region through the first opening or the first notch, a thickness of the slope part is gradually reduced in an extending direction of the slope part;
   a plurality of touch electrodes disposed on the thin film encapsulation layer in the first region;
   a first auxiliary retaining wall and a second auxiliary retaining wall in the second region, wherein the first auxiliary retaining wall is connected to the first auxiliary retaining wall at a first end of the first opening or the first notch, and the second auxiliary retaining wall is connected to the first auxiliary retaining wall at a second end of the first opening or the first notch, the first auxiliary retaining wall and the second auxiliary retaining wall are perpendicular to the first retaining wall;
   a plurality of pads disposed on the substrate in the second region; and
   a plurality of touch lines connecting the plurality of touch electrodes to the plurality of pads, wherein the plurality of touch lines are located on a top surface of the slope part;
   wherein the extending direction of the slope part is parallel to the first auxiliary retaining wall and the second auxiliary retaining wall, and the slope part is between the first auxiliary retaining wall and the second auxiliary retaining wall.

2. The touch display panel of claim 1, wherein the second region includes a bonding region, the plurality of pads is in the bonding region, the first opening or the first notch is provided on a side of the first retaining wall adjacent to the bonding region of the touch display panel.

3. The touch display panel of claim 1, wherein the first retaining wall includes a pixel defining layer, a planarization layer and a supporting spacer.

4. The touch display panel of claim 1, wherein a height of the first auxiliary retaining wall and a height of the second auxiliary retaining wall are both equal to a height of the first retaining wall.

5. The touch display panel of claim 1, wherein a length of the first auxiliary retaining wall in a direction perpendicular to a side of the first retaining wall where the first opening or the first notch is located is greater than or equal to a length of an organic layer of the thin film encapsulation layer in the second region.

6. The touch display panel of claim 1, wherein the first region and the second region are communicated through the first opening of the first retaining wall, the first opening penetrates through the first retaining wall in the direction perpendicular to the substrate at the first opening.

7. The touch display panel of claim 1, wherein the first region and the second region are communicated through the first notch of the first retaining wall, wherein a height of the first retaining wall where the first notch is located is greater than zero and less than a height of the first retaining wall where the first notch is not provided.

8. The touch display panel of claim 1, wherein the thin film encapsulation layer comprises inorganic layers and organic layers which are stacked alternately, with top and bottom layers being inorganic layers; and
   wherein the organic layers are located in the first region surrounded by the first retaining wall and only extend to the second region through the first opening or the first notch, and the inorganic layers cover the first retaining wall.

9. The touch display panel of claim 6, wherein the thin film encapsulation layer comprises a first inorganic layer on the organic light emitting structure, a first organic layer on the first inorganic layer, and a second inorganic layer on the first organic layer,
   wherein the first retaining wall is disposed under the first inorganic layer and the second inorganic layer, but not under the first organic layer.

10. The touch display panel of claim 7, wherein the thin film encapsulation layer comprises a first inorganic layer on the organic light emitting structure, a first organic layer on the first organic layer, and a second inorganic layer on the first organic layer,
    wherein the first retaining wall is under the first inorganic layer and the second inorganic layer, only the first retaining wall at the first notch is also under the first organic layer.

11. The touch display panel of claim 10, wherein a height of the first retaining wall at the first notch is denoted by h, a thickness of the first organic layer inside the first region is denoted by T, and 0<h<T.

12. The touch display panel of claim 11, wherein said thickness T is less than or equal to 20 μm.

13. The touch display panel of claim 12, wherein a length of the first organic layer in the slope part of the thin film encapsulation layer is L, and $$10 \leq \frac{L}{T} \leq 200.$$

14. The touch display panel of claim 10, wherein a length of the slope part in the second region is S+L, and 10 µm≤S≤500 µm.

15. The touch display panel of claim 1, wherein the touch line between the touch electrode and the first opening or the first notch is arranged in a region between the first retaining wall and the first region; or the touch line between the touch electrode and the first opening or the first notch is arranged in a region between the first retaining wall and the first region and in a region corresponding to a top portion of the first retaining wall.

16. The touch display panel of claim 1, wherein the thickness of the slope part is linearly reduced.

17. The touch display panel of claim 1, wherein a width of the first opening or the first notch is less than a length of a side of the first retaining wall where the first opening or the first notch is located.

18. A touch display panel, comprising:
a substrate;
a first retaining wall located on the substrate, wherein a side of the first retaining wall having a first opening, wherein a width of the first opening is less than a length of the side where the first opening is located;
a second retaining wall located on the substrate and encompassing the first retaining wall, wherein the first retaining wall and the second retaining wall define a first region surrounded by the first retaining wall, a second region between the first retaining wall and the second retaining wall, and a third region outside the second retaining wall, wherein a side of the second retaining wall has a second opening aligned with the first opening, wherein a width of the second opening is less than a length of the side where the second opening is located;
an organic light emitting structure located on the substrate and in the first region;
a thin film encapsulation layer disposed on the organic light-emitting structure and the first retaining wall, wherein the thin film encapsulation layer has a slope part, the slop part extends from the first region into the second region through the first opening of the first retaining wall but does not extend into the third region, a thickness of the slope part is gradually reduced;
a plurality of touch electrodes disposed on the thin film encapsulation layer and in the first region;
a plurality of pads disposed on the substrate and in the third region; and
a plurality of touch lines disposed on a top surface of the thin film encapsulation layer,
wherein the plurality of touch electrodes are connected to the plurality of pads by the plurality of touch lines, and the plurality of touch lines extends through the first opening and the second opening.

19. The touch display panel of claim 18, wherein the thickness of the slope part is linearly reduced.

20. A display apparatus, comprising a touch display panel, wherein the touch display panel comprises:
a substrate;
a first retaining wall located on the substrate, wherein the substrate is divided into a first region and a second region by the first retaining wall, the first region is surrounded by the first retaining wall, the first region and the second region are communicated through a first opening or a first notch of the first retaining wall;
an organic light emitting structure located in the first region;
a thin film encapsulation layer disposed on the organic light-emitting structure and the first retaining wall, wherein the thin film encapsulation layer has a slope part extending from the first region to the second region through the first opening or the first notch, a thickness of the slope part is gradually reduced in an extending direction of the slope part;
a plurality of touch electrodes disposed on the thin film encapsulation layer in the first region;
a first auxiliary retaining wall and a second auxiliary retaining wall in the second region, wherein the first auxiliary retaining wall is connected to the first auxiliary retaining wall at a first end of the first opening or the first notch, and the second auxiliary retaining wall is connected to the first auxiliary retaining wall at a second end of the first opening or the first notch, the first auxiliary retaining wall and the second auxiliary retaining wall are perpendicular to the first retaining wall;
a plurality of pads disposed on the substrate in the second region; and
a plurality of touch lines;
wherein the plurality of touch electrodes are connected to the plurality of pads by the plurality of touch lines, and the plurality of touch lines extends on a top surface of the slope part,
wherein the extending direction of the slope part is parallel to the first auxiliary retaining wall and the second auxiliary retaining wall, and the slope part is between the first auxiliary retaining wall and the second auxiliary retaining wall.

* * * * *